(12) United States Patent
Nakano

(10) Patent No.: US 8,134,111 B2
(45) Date of Patent: Mar. 13, 2012

(54) REVERSE BIAS PROCESSING APPARATUS AND REVERSE BIAS PROCESSING METHOD FOR PHOTOELECTRIC CONVERSION DEVICES

(75) Inventor: Takanori Nakano, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 382 days.

(21) Appl. No.: 12/442,596

(22) PCT Filed: Sep. 12, 2007

(86) PCT No.: PCT/JP2007/067725
§ 371 (c)(1),
(2), (4) Date: Mar. 24, 2009

(87) PCT Pub. No.: WO2008/041454
PCT Pub. Date: Apr. 10, 2008

(65) Prior Publication Data
US 2009/0224142 A1    Sep. 10, 2009

(30) Foreign Application Priority Data

Oct. 3, 2006  (JP) ................................. 2006-271686

(51) Int. Cl.
*G01J 1/44*    (2006.01)
(52) U.S. Cl. .................................................. 250/214 R
(58) Field of Classification Search ............. 250/214 R; 136/243–265, 290; 257/431–466; 438/12, 438/17, 73, 74
See application file for complete search history.

(56) References Cited

U.S. PATENT DOCUMENTS

| 4,806,496 | A | 2/1989 | Suzuki et al. |
| 6,365,825 | B1 | 4/2002 | Hayashi et al. |
| 2005/0284517 | A1 | 12/2005 | Shinohara |
| 2010/0330732 | A1* | 12/2010 | Tachibana ...................... 438/73 |

FOREIGN PATENT DOCUMENTS

| EP | 1 052 704 | 11/2000 |
| EP | 1 612 862 | 1/2006 |
| EP | 1 670 067 | 6/2006 |
| JP | 62-176172 | 8/1987 |
| JP | 62-176173 | 8/1987 |
| JP | 62-176174 | 8/1987 |
| JP | 10-004202 | 1/1998 |
| JP | 2000-323738 | 11/2000 |
| JP | 2001-237440 | 8/2001 |
| JP | 2003-037280 | 2/2003 |
| JP | 2006-013403 | 1/2006 |
| WO | 2008/041454 | 4/2008 |

OTHER PUBLICATIONS

International Search Report for PCT/JP2007/067725 mailed, Dec. 11, 2007.
International Search Report for PCT/JP2009/051333 mailed May 19, 2009 (2 pages).
Shinsuke Tachibana, U.S. Appl. No. 12/867,585, filed Aug. 13, 2010, entitled "Method and Device for Manufacturing Thin Film Photoelectric Conversion Module".

* cited by examiner

*Primary Examiner* — Georgia Y Epps
*Assistant Examiner* — Renee Naphas
(74) *Attorney, Agent, or Firm* — Nixon & Vanderhye P.C.

(57) ABSTRACT

When reverse bias processing is performed on a plurality of photoelectric conversion devices connected in series, different potentials are applied to electrodes of three or more photoelectric conversion devices to simultaneously perform reverse bias processing on two or more reverse photoelectric conversion devices. Thereby, time taken to perform reverse bias processing on the photoelectric conversion devices can be reduced.

19 Claims, 3 Drawing Sheets

US 8,134,111 B2

REVERSE BIAS PROCESSING APPARATUS AND REVERSE BIAS PROCESSING METHOD FOR PHOTOELECTRIC CONVERSION DEVICES

This application is the U.S. national phase of International Application No. PCT/JP2007/067725, filed 12 Sep. 2007 which designated the U.S. and claims priority to Japanese Application No. 2006-271686, filed 3 Oct. 2006, the entire contents of each of which are hereby incorporated by reference.

TECHNICAL FIELD

The present invention relates to a reverse bias processing apparatus and a reverse bias processing method for photoelectric conversion devices, and more particularly, to a reverse bias processing apparatus and a reverse bias processing method for photoelectric conversion devices performing reverse bias processing by applying a reverse bias voltage to photoelectric conversion devices connected in series.

BACKGROUND ART

In recent years, thin-film solar batteries formed by plasma CVD method using a gas as a raw material have been attracting attention. Examples of the thin-film solar batteries include silicon-based thin-film solar batteries formed of a silicon-based thin film, CIS or CIGS compound thin-film solar batteries, and the like, and development and production expansion are being promoted.

These thin-film solar batteries are formed by stacking a semiconductor film or an electrode film on a substrate by plasma CVD, sputtering, vacuum deposition, or the like. Since the thin-film solar battery has a thin semiconductor layer sandwiched between two electrodes, a short circuit is likely to occur between the electrodes due to a pin hole in the semiconductor layer, and thereby power generation characteristics are deteriorated. For the purpose of recovering such characteristics of the thin-film solar battery, Japanese Patent Laying-Open No. 2000-323738 describes an invention related to a reverse bias processing apparatus for a solar battery module in which a reverse bias voltage is applied between electrodes of solar battery cells to remove a short-circuited portion (pin hole).

Further, the reverse bias processing apparatus for a solar battery module described in Japanese Patent Laying-Open No. 2000-323738 is characterized by having probes in plural stages contacting electrodes of solar battery cells in three or more stages adjacent with one another, lifting and lowering means integrally lifting and lowering the probes in plural stages, and a switch selecting, from among the probes in plural stages, a pair of probes for applying a reverse bias voltage between electrodes of an arbitrary pair of adjacent solar battery cells. It is described that, since reverse bias processing can be performed on solar battery cells in plural stages by lowering the probes to bring them into contact with the electrodes of the solar battery cells and then switching the switch, the number of operations for lowering the probes, which is most time consuming, can be significantly reduced when compared with a conventional case, and the efficiency of the entire reverse bias processing can be improved.

FIGS. 5 and 6 are views for describing a reverse bias processing apparatus for conventional photoelectric conversion devices. FIG. 5 is a schematic cross sectional view of a plurality of conventional photoelectric conversion devices connected in series, and FIG. 6 shows an equivalent circuit thereof.

As shown in FIG. 5, a surface electrode 107 made of a transparent conductive film such as $SnO_2$, a semiconductor layer 108 including a photoelectric conversion layer, and a rear surface electrode 104 made of a metal and a transparent electrode are stacked on a transparent insulating substrate 106 such as glass. Surface electrode 107, semiconductor layer 108, and rear surface electrode 104 are partially removed, and electrical connection is established between a surface electrode 107a and a rear surface electrode 104b, between a surface electrode 107b and a rear surface electrode 104c, between a surface electrode 107c and a rear surface electrode 104d, between a surface electrode 107d and a rear surface electrode 104e, between a surface electrode 107e and a rear surface electrode 104f, and between a surface electrode 107f and a rear surface electrode 104g, of adjacent photoelectric conversion devices. Thereby, photoelectric conversion devices 103a to 103f are connected in series.

The equivalent circuit of FIG. 6 shows photoelectric conversion devices 103a to 103f and rear surface electrodes 104a to 104g. Herein, according to the apparatus of Japanese Patent Laying-Open No. 2000-323738, a reverse bias voltage is applied between rear surface electrode 104a and rear surface electrode 104b, that is, to photoelectric conversion device 103a, to perform reverse bias processing, and then the switch is used to apply the reverse bias voltage between rear surface electrode 104b and rear surface electrode 104c, that is, to photoelectric conversion device 103b, to perform reverse bias processing. Thereafter, reverse bias processing is sequentially performed up to photoelectric conversion device 103f.

Patent Document 1: Japanese Patent Laying-Open No. 2000-323738

DISCLOSURE OF THE INVENTION

Problems to be Solved by the Invention

In the case described above, however, there is a problem that, to perform reverse bias processing on all photoelectric conversion devices, it takes time corresponding to the number of the photoelectric conversion devices.

To solve the problem, it is conceivable to apply a reverse bias to a plurality of photoelectric conversion devices for simultaneous processing. However, in a case where two or more pairs of probes are selected to simultaneously perform reverse bias processing on a plurality of photoelectric conversion devices in the configuration of the apparatus of Japanese Patent Laying-Open No. 2000-323738, for example, if a high potential $V_H$ is applied to rear surface electrode 104a and rear surface electrode 104c and a low potential $V_L$ is applied to rear surface electrode 104b and rear surface electrode 104d to simultaneously perform reverse bias processing on photoelectric conversion device 103a and photoelectric conversion device 103c as shown in FIG. 7, a p-side electrode of photoelectric conversion device 103b is at high potential $V_H$ and an n-side electrode thereof is at low potential $V_L$. Accordingly, an excessive forward current $I_F$ flows through photoelectric conversion device 103b, destroying photoelectric conversion device 103b, or an excessive current exceeding a power capacity of a power supply supplying a reverse bias voltage flows, causing a problem that a voltage applied to each photoelectric conversion device cannot be maintained at a desired voltage.

In addition, in the configuration of the apparatus of Japanese Patent Laying-Open No. 2000-323738, it is impossible to simultaneously perform reverse bias processing on adjacent photoelectric conversion devices. For example, if an attempt is made to perform reverse bias processing on photoelectric conversion device 103a and photoelectric conversion device 103b, it is impossible to apply different potentials to surface electrode 107a of photoelectric conversion device 103a and rear surface electrode 104b as surface electrode 107a and rear surface electrode 104b are electrically connected. Therefore, it is impossible to simultaneously perform reverse bias processing on photoelectric conversion device 103a and photoelectric conversion device 103b.

Accordingly, an aspect of the present invention is directed to solve such problems, and one object of the present invention is to provide a reverse bias processing apparatus and a reverse bias processing method reducing time taken to perform reverse bias processing on a plurality of photoelectric conversion devices connected in series.

Means for Solving the Problems

According to an aspect of the present invention, provided is a reverse bias processing apparatus performing reverse bias processing by applying a reverse bias voltage to each of a plurality of photoelectric conversion devices connected in series, each of the plurality of photoelectric conversion devices having a first electrode, a photoelectric conversion semiconductor layer, and a second electrode sequentially formed on a substrate, and the second electrode being electrically connected with the first electrode of an adjacent photoelectric conversion device. The reverse bias processing apparatus includes potential generating means configured to be capable of outputting at least three potentials different from one another, and potential applying means simultaneously applying the generated at least three potentials different from one another to the first electrodes or second electrodes of at least three photoelectric conversion devices of the plurality of photoelectric conversion devices, respectively.

According to the present apparatus, when reverse bias processing is performed on the plurality of photoelectric conversion devices connected in series, reverse bias processing can be simultaneously performed on the plurality of photoelectric conversion devices, and thus time taken to perform reverse bias processing on the photoelectric conversion devices can be reduced.

Preferably, the potential applying means includes at least five electrode connection portions each brought into contact with the first electrode or second electrode and thereby applying the potential to the first electrode or second electrode, and selector means switching and outputting the at least three potentials different from one another to said electrode connection portions.

Preferably, the potential applying means simultaneously applies the potentials different from one another to all of the first electrodes or second electrodes of the plurality of photoelectric conversion devices.

More preferably, the reverse bias voltage applied to each of the plurality of photoelectric conversion devices is not more than a breakdown voltage of the photoelectric conversion devices.

According to another aspect of the present invention, provided is a reverse bias processing method for photoelectric conversion devices performing reverse bias processing by applying a reverse bias voltage to each of a plurality of photoelectric conversion devices connected in series, each of the plurality of photoelectric conversion devices having a first electrode, a photoelectric conversion semiconductor layer, and a second electrode sequentially formed on a substrate, and the second electrode being electrically connected with the first electrode of an adjacent photoelectric conversion device. The reverse bias processing method includes the steps of generating at least three potentials different from one another, and simultaneously performing reverse bias processing on at least two photoelectric conversion devices by simultaneously applying the generated at least three potentials different from one another to the first electrodes or second electrodes of at least three photoelectric conversion devices of the plurality of photoelectric conversion devices, respectively.

According to the present method, when reverse bias processing is performed on the plurality of photoelectric conversion devices connected in series, reverse bias processing can be simultaneously performed on the plurality of photoelectric conversion devices, and time taken to perform reverse bias processing on the photoelectric conversion devices can be reduced.

Preferably, photoelectric conversion devices not subjected to reverse bias processing are connected in series between the at least two photoelectric conversion devices simultaneously subjected to reverse bias processing. The reverse bias processing method further includes the step of applying an identical potential to the first or second electrodes of the photoelectric conversion devices not subjected to reverse bias processing.

Preferably, in the plurality of photoelectric conversion devices simultaneously subjected to reverse bias processing, the second electrode of one photoelectric conversion device is electrically connected with the first electrode of another photoelectric conversion device.

More preferably, the step of simultaneously performing reverse bias processing on at least two photoelectric conversion devices includes the step of applying the potentials different from one another to all of the first electrodes or second electrodes of the plurality of photoelectric conversion devices.

Preferably, the voltage applied the plurality of photoelectric conversion devices simultaneously subjected to reverse bias processing is not more than a breakdown voltage of the photoelectric conversion devices.

Effects of the Invention

According to the present apparatus and the present method, reverse bias processing can be simultaneously performed on at least two photoelectric conversion devices of a plurality of photoelectric conversion devices connected in series. Specifically, a reverse bias is applied by applying different potentials to the electrodes of the plurality of photoelectric conversion devices that should be subjected to processing, reverse bias processing can be simultaneously performed on the plurality of photoelectric conversion devices that should be subjected to processing even when they are directly connected in series.

Further, even when the plurality of photoelectric conversion devices that should be subjected to reverse bias processing are not directly connected in series and a photoelectric conversion device not subjected to reverse bias processing is present therebetween, reverse bias processing can be simultaneously performed on the photoelectric conversion devices that should be subjected to processing, while preventing an excessive current that may be caused by operating the interposed photoelectric conversion device not subjected to reverse bias processing in a forward direction.

Thereby, time taken to perform reverse bias processing on the photoelectric conversion, devices can be reduced.

Figure 1:
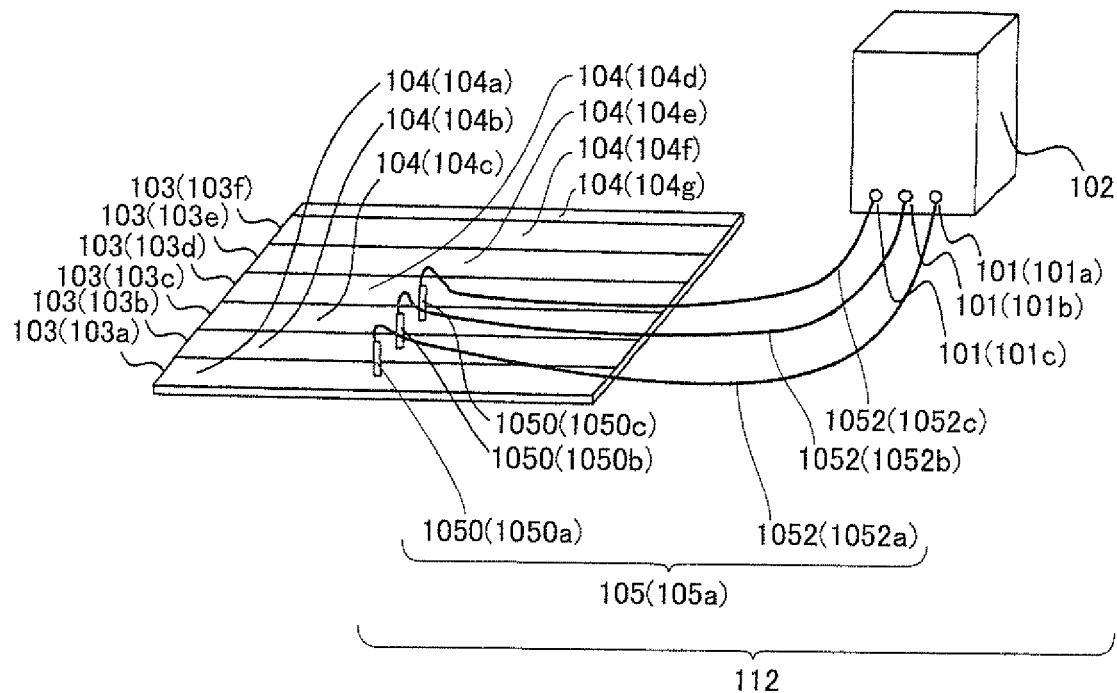
FIG. 1 is a schematic diagram of a reverse bias processing apparatus for photoelectric conversion devices in accordance with a first embodiment of the present invention.

DESCRIPTION OF THE REFERENCE SIGNS 101, 101a to 101c, 110, 110a to 110g: output terminal, 102: power supply, 103, 103a to 103f: photoelectric conversion device, 104, 104a to 104g: rear surface electrode, 105, 105a to 105f: conductive member, 106: transparent insulating substrate, 107, 107a to 107f: surface electrode, 108: semiconductor layer, 109: selector circuit, 111, 111a to 111c: input terminal, 112, 114: potential applying apparatus, 1050, 1050a to 1050c: electrode connection portion, 1052, 1052a to 1052c: wiring portion, 109: selector circuit, 1090: selector portion, 1092: switch portion.

BEST MODES FOR CARRYING OUT THE INVENTION

Hereinafter, embodiments of the present invention will be described in detail with reference to the drawings, in which identical or corresponding parts will be designated by the same reference numerals.

First Embodiment

Hereinafter, an embodiment of a reverse bias processing apparatus for photoelectric conversion devices in accordance with the present invention will be described in conjunction with the drawings.

FIG. 1 is a schematic diagram of a reverse bias processing apparatus for photoelectric conversion devices in accordance with a first embodiment.

Referring to FIG. 1, the reverse bias processing apparatus for photoelectric conversion devices includes a potential applying apparatus 112 for applying a reverse bias voltage to a plurality of photoelectric conversion devices 103a to 103f connected in series.

Figure 5:
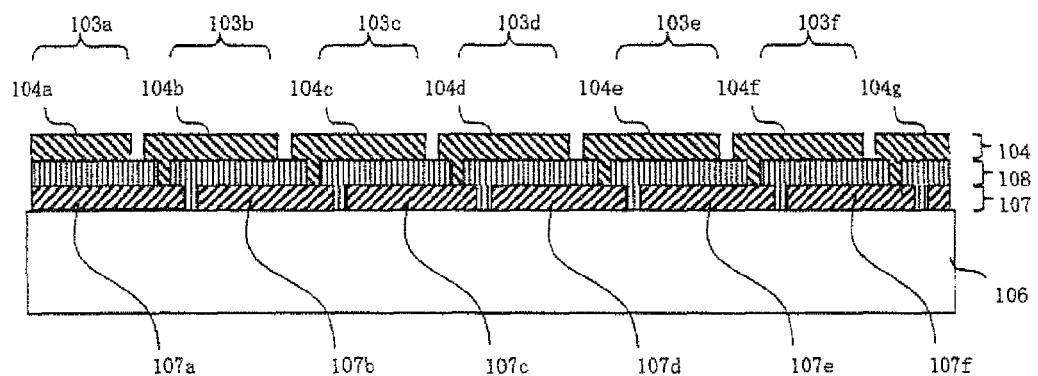
FIG. 5 is a schematic cross sectional view of a plurality of conventional photoelectric conversion devices connected in series.
Figure 6:
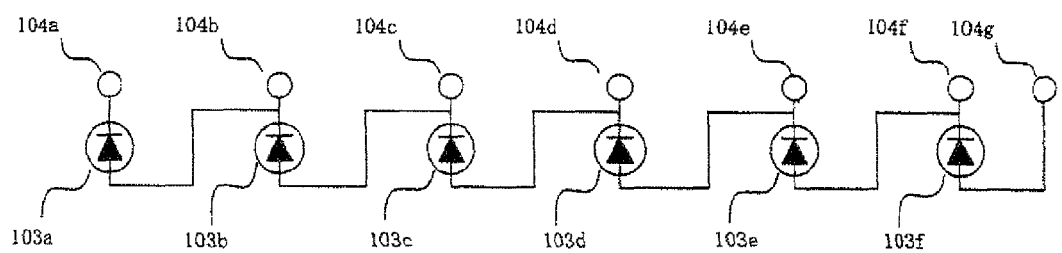
FIG. 6 is an equivalent circuit diagram of the plurality of conventional photoelectric conversion devices connected in series.
Figure 7:
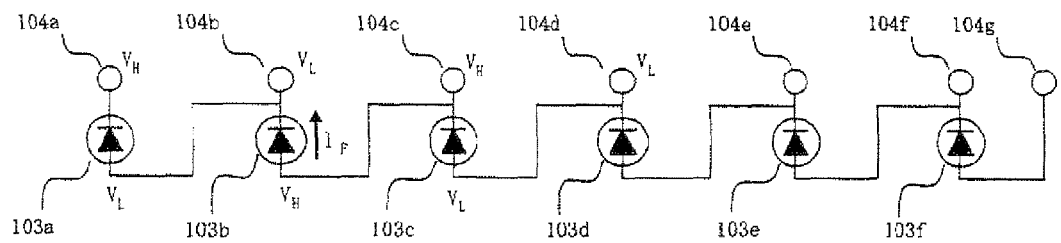
FIG. 7 is an equivalent circuit diagram of photoelectric conversion devices for describing a problem in a conventional reverse bias processing apparatus.

The plurality of photoelectric conversion devices 103a to 103f have the same structure as the plurality of conventional photoelectric conversion devices 103a to 103f described above (FIG. 5). Specifically, photoelectric conversion devices 103a to 103f have a structure in which surface electrodes, semiconductor layers (both not shown), and rear surface electrodes 104a to 104g are stacked on a transparent insulating substrate. In the respective photoelectric conversion devices, rear surface electrodes 104a to 104f are electrically connected to the surface electrodes of adjacent photoelectric conversion devices, and thereby photoelectric conversion devices 103a to 103f are connected in series.

It is to be noted that, hereinafter, numerals 103 and 104 are used to collectively refer to photoelectric conversion devices 103a to 103f and rear surface electrodes 104a to 104g, respectively.

Potential applying apparatus 112 outputs at least three potentials different from one another, and simultaneously applies the potentials to rear surface electrodes 104 of at least three photoelectric conversion devices 103. Hereinafter, a case where potential applying apparatus 112 simultaneously applies three potentials to rear surface electrodes 104 of three photoelectric conversion devices will be described as an example.

Potential applying apparatus 112 includes a power supply 102 having a plurality of output terminals 101a to 101c configured to be capable of simultaneously outputting potentials different from one another, and a plurality of conductive members 105a to 105c connected to the plurality of output terminals 101a to 101c, respectively. It is to be noted that, hereinafter, numerals 101 and 105 are used to collectively refer to output terminals 101a to 101c and conductive members 105a to 105c, respectively.

The respective plurality of conductive members 105 include electrode connection portions 1050 and wiring portions 1052 provided between electrode connection portions 1050 and output terminals 101. Specifically, conductive member 105a includes an electrode connection portion 1050a and a wiring portion 1052a provided between electrode connection portion 1050a and output terminal 101a. Further, conductive member 105b includes an electrode connection portion 1050b and a wiring portion 1052b provided between electrode connection portion 1050b and output terminal 101b. Furthermore, conductive member 105c includes an electrode connection portion 1050c and a wiring portion 1052c provided between electrode connection portion 1050c and output terminal 101c.

Three potentials different from one another are respectively output from the plurality of output terminals 101 of power supply 102. In the present embodiment, it is assumed for example that a potential of +3 V is output from output terminal 101a, a potential of 0 V is output from output terminal 101b, and a potential of −3 V is output from output terminal 101c.

In the present embodiment, power supply 102 constitutes an example of the "potential generating means", and the plurality of conductive members 105a to 105c connected to the plurality of output terminals 101a to 101c of power supply 102, respectively, constitute examples of the "potential applying means". Since the reverse bias processing apparatus has a constitution as described above in the present embodiment, the reverse bias processing apparatus can simultaneously apply a reverse bias voltage of 3 V to two photoelectric conversion devices 103. Therefore, it becomes possible to simultaneously perform reverse bias processing on the two photoelectric conversion devices 103.

Although the reverse bias voltage is set to 3 V in the present embodiment, the reverse bias voltage may be any voltage not more than a breakdown voltage of photoelectric conversion devices 103 to prevent a PN junction in photoelectric conversion devices 103 from being broken and short-circuited. The breakdown voltage of photoelectric conversion devices 103 is generally around several to 20 volts, although it may differ depending on the structure of the semiconductor layer, such as the film thickness, the number of layers, and the like thereof.

Hereinafter, a reverse bias processing method using the reverse bias processing apparatus in accordance with the present embodiment will be described. The reverse bias processing method in accordance with the present embodiment is directed to simultaneously performing reverse bias processing on the plurality of photoelectric conversion devices 103 adjacent to one another and connected in series.

Specifically, as shown in FIG. 1, electrode connection portions 1050a, 1050b, 1050c are brought into contact with rear surface electrodes 104a, 104b, 104c of photoelectric conversion devices 103a, 103b, 103c, respectively, and thereby electrical connection is established between rear surface electrodes 104a, 104b, 104c and output terminals 101a, 101b, 101c of power supply 102, respectively. Then, in this state, a potential of +3 V is output at output terminal 101a, a potential of 0 V is output at output terminal 101b, and a potential of −3 V is output at output terminal 101c. Thereby, a potential of +3 V is applied to rear surface electrode 104a, a potential of 0 V is applied to rear surface electrode 104b, and a potential of −3 V is applied to rear surface electrode 104c.

Figure 2:
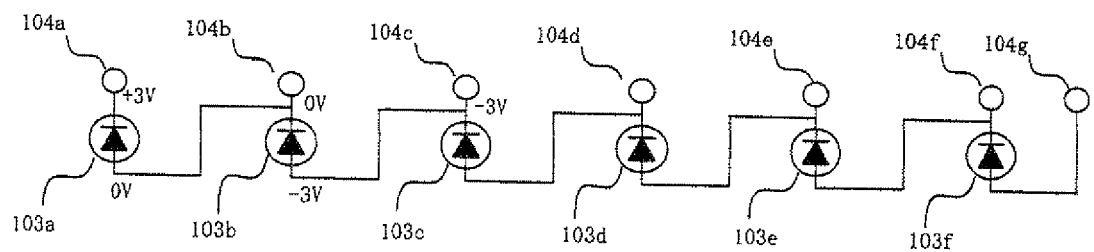
FIG. 2 is an equivalent circuit diagram of the photoelectric conversion devices showing a reverse bias processing method in accordance with the first embodiment of the present invention.

FIG. 2 is an equivalent circuit diagram of photoelectric conversion devices 103 in accordance with the present embodiment.

By applying the potentials described above to rear surface electrodes 104a to 104c, a reverse bias voltage of 3 V is simultaneously applied to photoelectric conversion device 103a and photoelectric conversion device 103b, as shown in FIG. 2. Therefore, reverse bias processing can be simultaneously performed on these photoelectric conversion devices 103a and 103b.

Further, since no voltage is applied to the remaining photoelectric conversion devices 103c to 103f on this occasion, there occurs no problem due to the operation of these photoelectric conversion devices in a forward direction as transistors and the like.

After reverse bias processing is performed on photoelectric conversion devices 103a and 103b, in accordance with the method described above, electrode connection portions 1050a, 1050b, 1050c are brought into contact with rear surface electrodes 104c, 104d, 104e, respectively, and thereby electrical connection is established between rear surface electrodes 104c, 104d, 104e and output terminals 101a, 101b, 101c, respectively. Then, in this state, a potential of +3 V is output at output terminal 101a, a potential of 0 V is output at output terminal 101b, and a potential of −3 V is output at output terminal 101c. Thereby, a reverse bias voltage of 3 V is simultaneously applied to photoelectric conversion device 103c and photoelectric conversion device 103d. Therefore, reverse bias processing can be simultaneously performed on these photoelectric conversion devices 103c and 103d.

Further, after reverse bias processing is performed on photoelectric conversion devices 103c and 103d, in accordance with the method described above, electrode connection portions 1050a, 1050b, 1050c are brought into contact with rear surface electrodes 104e, 104f, 104g, respectively, and thereby electrical connection is established between rear surface electrodes 104e, 104f, 104g and output terminals 101a, 101b, 101c, respectively. Then, in this state, a potential of +3 V is output at output terminal 101a, a potential of 0 V is output at output terminal 101b, and a potential of −3 V is output at output terminal 101c. Thereby, a reverse bias voltage of 3 V is simultaneously applied to photoelectric conversion device 103e and photoelectric conversion device 103f. Therefore, reverse bias processing can be simultaneously performed on these photoelectric conversion devices 103e and 103f.

Consequently, reverse bias processing can be performed on all of the plurality of photoelectric conversion devices 103a to 103f.

Although the number of the output potentials from power supply 102, the number of output terminals 101, and the number of conductive members 105 are respectively set to three in the present embodiment, the numbers of the output potentials, output terminals 101, and conductive members 105 can be increased to deal with a case where a large number of photoelectric conversion devices 103 are connected in series. Further, it is also possible to perform reverse bias processing on all of photoelectric conversion devices 103 at once by providing the output potentials, output terminals 101, and conductive members 105 to correspond to all of rear surface electrodes 104a to 104g of photoelectric conversion devices 103a to 103f.

According to the reverse bias processing method in accordance with the present embodiment, reverse bias processing can be simultaneously performed on two or more photoelectric conversion devices 103, and thus time taken for the processing can be reduced.

In the present embodiment and embodiments described below, simultaneously performing reverse bias processing is not limited to a case where reverse bias processing for the plurality of photoelectric conversion devices is simultaneously started and finished, and includes a case where reverse bias processing is started at different points of time and a case where reverse bias processing is finished at different points of time. That is, it is satisfactory as long as a reverse bias voltage is applied to the plurality of photoelectric conversion devices at a certain point of time to perform reverse bias processing.

Although electrode connection portions 1050 are brought into contact with rear surface electrodes 104 in the present embodiment and the embodiments described below, electrode connection portions 1050 may be brought into contact with surface electrodes 107 if surface electrodes 107 are exposed. That is, electrode connection portions 1050 may be brought into contact with any of rear surface electrodes 104 and surface electrodes 107.

Further, although super-straight type photoelectric conversion devices using a transparent substrate are illustrated in the present embodiment and the embodiments described below, the present invention can also be implemented in sub-straight type photoelectric conversion devices using an opaque substrate.

Second Embodiment

Hereinafter, another embodiment of a reverse bias processing apparatus for photoelectric conversion devices in accordance with the present invention will be described in conjunction with the drawing.

Figure 3:
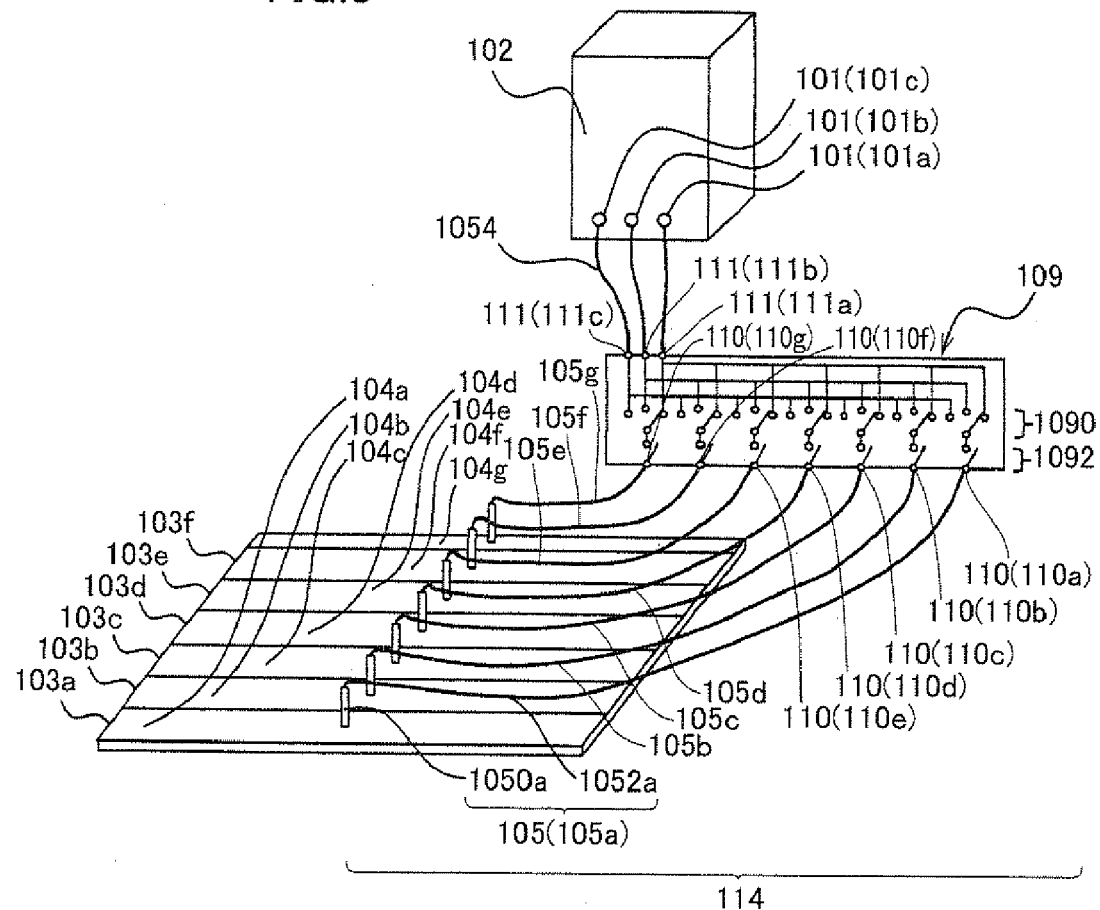
FIG. 3 is a schematic diagram of a reverse bias processing apparatus for photoelectric conversion devices in accordance with a second embodiment of the present invention.

FIG. 3 is a schematic diagram of a reverse bias processing apparatus for photoelectric conversion devices in accordance with a second embodiment.

Referring to FIG. 3, the reverse bias processing apparatus for photoelectric conversion devices in accordance with the present embodiment includes a potential applying apparatus 114 for applying a reverse bias voltage to the plurality of photoelectric conversion devices 103 connected in series.

As in the aforementioned embodiment, the plurality of photoelectric conversion devices 103 have the same structure as the plurality of conventional photoelectric conversion devices 103a to 103f described above (FIG. 5).

Potential applying apparatus 114 includes power supply 102, a selector circuit 109, conductive members 105, and wiring portions 1054.

Selector circuit 109 includes a plurality of input terminals 111a to 111c and a plurality of output terminals 110a to 110g. It is to be noted that, hereinafter, numerals 111 and 110 are used to collectively refer to input terminals 111a to 111c and output terminals 110 at 110g, respectively.

Output terminals 101a to 101c of power supply 102 are connected to input terminals 111a to 111c of selector circuit 109, respectively, via wiring portions 1054. Output terminals 110a to 110g of selector circuit 109 are connected to rear surface electrodes 104a to 104g of photoelectric conversion devices 103a to 103f via the plurality of conductive members 105 (105a to 105g).

The respective conductive members 105 have the same structure as conductive members 105 in the aforementioned embodiment (FIG. 1). Accordingly, by bringing electrode connection portions 1050 into contact with corresponding rear surface electrodes 104, electric connection is established between rear surface electrodes 104 and output terminals 110 of selector circuit 109.

Selector circuit 109 has a function of switching electrical connection between input terminals 111 and output terminals 110. Selector circuit 109 can connect each of input terminals 111 to at least one or more output terminals 110.

In the present embodiment, selector circuit 109 includes, for example, a plurality of selector portions 1090 connected in parallel with respect to input terminals 111, and a plurality of switch portions 1092 connected between the plurality of selector portions 1090 and output terminals 110a to 110g, respectively.

Each of the plurality of selector portions 1090 connects one of input terminals 111a to 111c to corresponding switch portion 1092. Then, by placing switch portion 1092 in a conductive state, electrical connection is established between one selected input terminal 111 and corresponding output terminal 110.

Three potentials different from one another are respectively output from output terminals 101 of power supply 102. It is satisfactory as long as three or more output terminals 101 are provided and the simultaneously output potentials have three or more values different from one another. In the present embodiment, it is assumed for example that a potential of +3 V is output from output terminal 101a, a potential of 0 V is output from output terminal 101b, and a potential of −3 V is output from, output terminal 101c.

Therefore, each of the three potentials respectively output from output terminals 101a, 101b, 101c is applied to rear surface electrode 104 of any photoelectric conversion device 103 via output terminal 110 selected by selector circuit 109.

Since the reverse bias processing apparatus has a constitution as described above in the present embodiment, the reverse bias processing apparatus can simultaneously apply a reverse bias voltage of 3 V to any two photoelectric conversion devices 103 selected by selector circuit 109. Therefore, it becomes possible to simultaneously perform reverse bias processing on the two photoelectric conversion devices 103.

Further, since there is no need to move positions of electrode connection portions 1050 or photoelectric conversion devices 103 when selecting photoelectric conversion devices 103 to be subjected to reverse bias processing, a drive unit of the reverse bias processing apparatus can be simplified.

Third Embodiment

Hereinafter, another embodiment of a reverse bias processing method for photoelectric conversion devices of the present invention will be described in conjunction with the drawing.

The reverse bias processing method in accordance with a third embodiment is directed to simultaneously performing reverse bias processing on the plurality of photoelectric conversion devices 103 not adjacent to one another.

Figure 4:
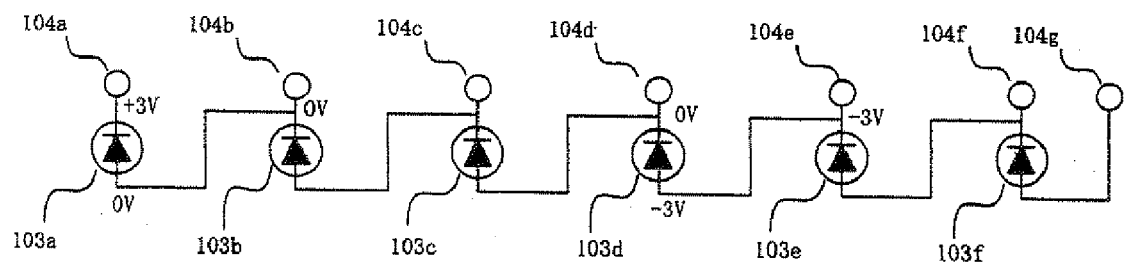
FIG. 4 is an equivalent circuit diagram of photoelectric conversion devices showing a reverse bias processing method in accordance with a third embodiment of the present invention.

FIG. 4 is a view for illustrating the reverse bias processing method in accordance with the third embodiment, which is an equivalent circuit diagram of photoelectric conversion devices connected in series.

Referring to FIG. 4, a potential of +3 V is applied to rear surface electrode 104a, a potential of 0 V is applied to rear surface electrode 104b and rear surface electrode 104d, and a potential of −3 V is applied to rear surface electrode 104e. Thereby, a reverse bias voltage of 3 V is simultaneously applied to photoelectric conversion device 103a and photoelectric conversion device 103d. Therefore, reverse bias processing can be simultaneously performed on these photoelectric conversion devices 103a and 103d.

It is to be noted that, since no voltage is applied to photoelectric conversion device 103b and photoelectric conversion device 103c located between photoelectric conversion device 103a and photoelectric conversion device 103d simultaneously subjected to reverse bias processing on this occasion, there occurs no problem due to the operation of these photoelectric conversion devices in a forward direction as transistors and the like.

Further, in the present embodiment, 0 V may further be applied to rear surface electrode 104c, and an identical potential of 0 V may be applied to all electrodes of photoelectric conversion device 103b and photoelectric conversion device 103c located between photoelectric conversion device 103a and photoelectric conversion device 103d simultaneously subjected to reverse bias, processing.

Although an identical potential is applied to rear surface electrode 104b and rear surface electrode 104d in the present embodiment, different potentials may also be applied thereto. In this case, however, it is necessary to prevent a large current from flowing through photoelectric conversion device 103b and photoelectric conversion device 103c due to the operation of these photoelectric conversion device 103b and photoelectric conversion device 103c in a forward direction.

Therefore, it is desirable not to operate the photoelectric conversion device not subjected to reverse bias processing, such as photoelectric conversion devices 103b and 103c, in a forward direction. However, the present method can be used in a case where a forward current flows in an amount not breaking the photoelectric conversion device even when the photoelectric conversion device is operated in a forward direction, or in a case where the forward current is within a power capacity range of power supply 102 and the applied voltage is not reduced even when the forward current flows.

The method in accordance with the present embodiment is effective for simultaneously performing reverse bias processing on photoelectric conversion devices 103 that are located apart and should be subjected to reverse bias processing.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

Industrial Applicability

The present invention is applicable to a reverse bias processing apparatus for photoelectric conversion devices performing reverse bias processing by applying a reverse bias voltage to the photoelectric conversion devices connected in series.

The invention claimed is:

1. A reverse bias processing apparatus performing reverse bias processing by applying a reverse bias voltage to each of a plurality of photoelectric conversion devices connected in series, each of said plurality of photoelectric conversion devices having a first electrode, a photoelectric conversion semiconductor layer, and a second electrode sequentially formed on a substrate, and said second electrode being electrically connected with said first electrode of an adjacent photoelectric conversion device, comprising:

potential generating means configured to be capable of outputting at least three potentials different from one another; and potential applying means simultaneously applying said generated at least three potentials different from one another to said first electrodes or second electrodes of at least three photoelectric conversion devices of said plurality of photoelectric conversion devices, respectively.

2. The reverse bias processing apparatus for photoelectric conversion devices according to claim 1, wherein said potential applying means includes at least five electrode connection portions each brought into contact with said first electrode or second electrode and thereby applying the potential to said first electrode or second electrode, and selector means switching and outputting said at least three potentials different from one another to said electrode connection portions.

3. The reverse bias processing apparatus for photoelectric conversion devices according to claim 2, wherein the reverse bias voltage applied to each of said plurality of photoelectric conversion devices is not more than a breakdown voltage of said photoelectric conversion devices.

4. The reverse bias processing apparatus for photoelectric conversion devices according to claim 1, wherein said potential applying means simultaneously applies the potentials different from one another to all of said first electrodes or second electrodes of said plurality of photoelectric conversion devices.

5. The reverse bias processing apparatus for photoelectric conversion devices according to claim 4, wherein the reverse bias voltage applied to each of said plurality of photoelectric conversion devices is not more than a breakdown voltage of said photoelectric conversion devices.

6. The reverse bias processing apparatus for photoelectric conversion devices according to claim 1, wherein the reverse bias voltage applied to each of said plurality of photoelectric conversion devices is not more than a breakdown voltage of said photoelectric conversion devices.

7. A reverse bias processing method for photoelectric conversion devices performing reverse bias processing by applying a reverse bias voltage to each of a plurality of photoelectric conversion devices connected in series, each of said plurality of photoelectric conversion devices having a first electrode, a photoelectric conversion semiconductor layer, and a second electrode sequentially formed on a substrate, and said second electrode being electrically connected with said first electrode of an adjacent photoelectric conversion device, comprising the steps of:

generating at least three potentials different from one another; and simultaneously performing reverse bias processing on at least two photoelectric conversion devices by simultaneously applying said generated at least three potentials different from one another to said first electrodes or second electrodes of at least three photoelectric conversion devices of said plurality of photoelectric conversion devices, respectively.

8. The reverse bias processing method for photoelectric conversion devices according to claim 7, wherein photoelectric conversion devices not subjected to reverse bias processing are connected in series between said at least two photoelectric conversion devices simultaneously subjected to reverse bias processing, and said method further comprises the step of applying an identical potential to said first or second electrodes of at least two photoelectric conversion devices not subjected to reverse bias processing.

9. The reverse bias processing method for photoelectric conversion devices according to claim 8, wherein the identical potential is applied to the first electrode and the second electrode electrically connected to either ends of said plurality of photoelectric conversion devices not subjected to reverse bias processing.

10. The reverse bias processing method for photoelectric conversion devices according to claim 7, wherein, in said plurality of photoelectric conversion devices simultaneously subjected to reverse bias processing, said second electrode of one photoelectric conversion device is electrically connected with said first electrode of another photoelectric conversion device.

11. The reverse bias processing method for photoelectric conversion devices according to claim 10, wherein said step of simultaneously performing reverse bias processing on at least two photoelectric conversion devices includes the step of applying the potentials different from one another to all of said first electrodes or second electrodes of said plurality of photoelectric conversion devices.

12. The reverse bias processing method for photoelectric conversion devices according to claim 11, wherein the voltage applied to said plurality of photoelectric conversion devices simultaneously subjected to reverse bias processing is not more than a breakdown voltage of said photoelectric conversion devices.

13. A reverse bias processing method for photoelectric conversion devices applying a reverse bias voltage to each of a plurality of photoelectric conversion devices connected in series, the method comprising the step of simultaneously performing reverse bias processing on a plurality of photoelectric conversion devices not adjacent to one another by simultaneously applying the reverse bias voltage to said plurality of photoelectric conversion devices not adjacent to one another, wherein, in said step of simultaneously performing said reverse bias processing on said plurality of photoelectric conversion devices, said reverse voltage is applied such that one or more photoelectric conversion devices not subjected to reverse bias processing connected in series between said plurality of photoelectric conversion devices subjected to reverse bias processing do not perform forward bias operation.

14. A manufacturing method for photoelectric conversion devices, the method comprising:

manufacturing a plurality of photoelectric conversion devices connected in series, each of said plurality of photoelectric conversion devices having a first electrode, a photoelectric conversion semiconductor layer, and a second electrode sequentially formed on a substrate, and said second electrode being electrically connected with said first electrode of an adjacent photoelectric conversion device; and performing a reverse bias processing method for said plurality of photoelectric conversion devices according to claim 13.

15. A potential applying apparatus arranged to perform a reverse bias processing on a plurality of photoelectric conversion devices connected in series, each photoelectric conversion device comprising a first electrode, a photoelectric conversion semiconductor layer, and a second electrode sequentially formed on a substrate, and the second electrode being electrically connected with the first electrode of an adjacent photoelectric conversion device, the apparatus comprising:

a power supply arranged to simultaneously generate at least three potentials different from each other; and a plurality of conductive members arranged to simultaneously apply the at least three potentials generated by the power supply to terminals of at least three photoelectric conversion devices so as to simultaneously subject at least two of the at least three photoelectric conversion devices to the reverse bias processing, the terminal of each photoelectric conversion device being one of the first and the second electrode.

16. The potential applying apparatus of claim 15, wherein the power supply comprises at least three power supply output terminals, each power supply output terminal being arranged to output one of the at least three potentials, and wherein the apparatus further comprises a selector circuit arranged to selectively deliver each of the at least three potentials generated from the power supply to each of the plurality of conductive members, the selector circuit comprising:

a plurality of selector circuit input terminals electrically connected to the power supply output terminals such that all of the at least three potentials are input to the selector circuit;

a plurality of selector circuit output terminals electrically connected to the plurality of conductive members; and a plurality of switches arranged to switch electrical connections between the plurality of selector circuit input terminals and the plurality of selector circuit output terminals such that each selector circuit input terminal is electrically connected to one or more selector circuit output terminals.

17. The potential applying apparatus of claim 15, wherein the plurality of conductive members is arranged to simultaneously apply the at least three potentials generated by the power supply to the terminals of the at least three photoelectric conversion devices without subjecting any photoelectric conversion device to operate in a forward direction.

18. A method for performing reverse bias processing on a plurality of photoelectric conversion devices connected in series, each photoelectric conversion device comprising a first electrode, a photoelectric conversion semiconductor layer, and a second electrode sequentially formed on a substrate, and the second electrode being electrically connected with the first electrode of an adjacent photoelectric conversion device, the method comprising:

simultaneously applying at least three different potentials generated by a power supply to terminals of at least three photoelectric conversion devices so as to simultaneously subject at least two of the at least three photoelectric conversion devices to the reverse bias processing, the terminal of each photoelectric conversion device being one of the first and the second electrode.

19. The method of claim 18, wherein in the step of simultaneously applying the at least three potentials generated by the power supply to the terminals of the at least three photoelectric conversion devices is performed without subjecting any photoelectric conversion device to operate in a forward direction.

* * * * *